United States Patent [19]

Kozlovsky et al.

[11] Patent Number: 5,687,185
[45] Date of Patent: Nov. 11, 1997

[54] LASER CATHODE-RAY TUBE

[75] Inventors: Vladimir I. Kozlovsky; Boris M. Lavrushin, both of Moscow, Russian Federation

[73] Assignees: Principia Optics, Inc., Los Angeles, Calif.; Principia, Optics, Ltd., Moscow, Russian Federation

[21] Appl. No.: 481,247

[22] PCT Filed: Dec. 27, 1993

[86] PCT No.: PCT/RU93/00318

§ 371 Date: Oct. 28, 1995

§ 102(e) Date: Oct. 28, 1995

[87] PCT Pub. No.: WO94/15353

PCT Pub. Date: Jul. 7, 1994

[30] Foreign Application Priority Data

Dec. 28, 1992 [RU] Russian Federation ........ 92014713/21

[51] Int. Cl.⁶ .................... H02S 3/19; H02J 29/10
[52] U.S. Cl. .................... 372/43; 313/463; 313/474; 372/74
[58] Field of Search .............. 372/74, 45, 43; 313/474, 463

[56] References Cited

U.S. PATENT DOCUMENTS

| | | | |
|---|---|---|---|
| 3,558,956 | 1/1971 | Basov et al. | 313/421 |
| 3,864,645 | 2/1975 | Packard et al. | 331/94.5 |
| 3,982,207 | 9/1976 | Dingle et al. | 331/94 |
| 4,539,687 | 9/1985 | Gordon et al. | 372/43 |
| 4,695,332 | 9/1987 | Gordon et al. | 437/126 |
| 4,866,489 | 9/1989 | Yokogawa | 357/17 |
| 5,181,218 | 1/1993 | Ishikawa et al. | 372/45 |
| 5,374,870 | 12/1994 | Akhekyan et al. | 313/474 |

FOREIGN PATENT DOCUMENTS

| | | | |
|---|---|---|---|
| 0284031 | 9/1988 | European Pat. Off. | H01S 3/19 |
| 0454566 | 10/1991 | European Pat. Off. | H01S 1/30 |
| 270100 | 8/1970 | U.S.S.R. | H01J 29/18 |

OTHER PUBLICATIONS

"Electron beam pumped lasing in ZnSe/ZnSSe superlattice structures grown by molecular-beam epitaxy" by D.A. Cammack, R.J. Dalby and J. Khurgin of Applied Physics vol. 62, No. 7, 1 Oct.,87, Woodbury, US.

"Blue Solid State Laser Based On Electron–Beam Pumped ZnSe/ZnSSe Double Heterostructures" by H.J. Cornelissen, C.J. Savert and J.M. Gaines, Philips Journal of Research vol. 46 Nos 4–5 1992, Philips Research Laboratories, The Netherlands.

*Primary Examiner*—James W. Davie
*Attorney, Agent, or Firm*—John F. Sicotte

[57] ABSTRACT

A laser cathode-ray tube having an electron beam source, a means for its control, and a laser target containing a supporting substrate, a cavity resonator formed by two mirrors and multilayer semiconductor structure having active and passive strained layers, whose difference in lattice parameters in a free state is up to 10% or more and which have coherent boundaries between each other in the structure.

37 Claims, 2 Drawing Sheets

LASER CATHODE-RAY TUBE

CROSS-REFERENCES TO RELATED APPLICATIONS

This application is related to Applicant's Russian application Serial No. 92014713/21, filed Dec. 28, 1992 and International application Serial No. PCT/RU/00318, filed Dec. 27, 1993 on which Applicants claim foreign priority under 35 U.S.C.§§119 and 365.

FIELD OF THE INVENTION

The invention belongs to the field of quantum electronics and electronic engineering and may be used in devices where a scanning light beam is used, more particularly in television projector systems.

BACKGROUND OF THE INVENTION

A prior art laser cathode-ray tube being in fact a scanning semiconductor laser with longitudinal pumping by an electron beam comprises a source of an electron beam and a means for its control, and also a laser target which is a semiconductor member with mirror coverings, which forms an optical resonator. The laser target is glued to a heat removing substrate which is transparent to a generated laser beam (A.S.Nasibov. "Laser cathode-ray tube—new device of the quantum electronics".—Bulletin of the Academy of Sciences of the USSR, No.9, pp.48–56). The electron beam penetrates through one of mirrors into semiconductor member, excites some region of this member wherein it causes nonequilibrium current carriers—electron-hole pairs, which recombine with emitting light. The optical gain aroused in this excited region and optical resonator generates the laser beam. The laser beam is generated from a spot on the laser target where the focused electron beam to be located. The laser beam scanning and modulation of its intensity are made by scanning of the electron beam and changing its current.

The main disadvantage of this device is that high efficiency and long lifespan of the laser target can only be achieved simultaneously only at cryogenic temperature. The reason is due the to level of excitation of semiconductor member with electron beam pumping is very non-uniform over the volume of the member. Thus, if a semiconductor member is used which has a thickness of more than the average depth of the electron beam excitation of the target, there are parts of the member which are little-excited or not excited at all. These parts, however, absorb light emanating from the high-excited parts. This is especially true when the member is at temperatures higher than cryogenic temperatures. This decreases laser efficiency and the lifespan of the member. If a thinner semiconductor member is used the laser efficiency may be high enough and in some cases electrons can to penetrate through the member and partly transparent mirror covering into glue layer and destroy it, making the lifespan small.

Another kind of prior art laser cathode-ray tube has a laser target made of a semiconductor with a two-layer structure (A. A. Matyash et al, "Semiconductor laser with longitudinal electron pumping", USSR Patent No.1034569, issued Nov. 2, 1981 and described in a paper by V. N. Katsap et al., "Heterostructures $CdS_xSe_{1-x}$/CdS in Lasers with Longitudinal Pumping by Electron Beam", Sov. J. of Quantum Electronics, 1997, Vol.14, pp.1994–1997). The layer of $CdS_xSe_{1-x}$ with narrower bandgap is pumped by an electron beam and its thickness is approximately equal to the typical depth of penetration of an electron beam into a laser target. The wider bandgap layer of CdS has thickness several times larger and performs two functions: on one hand, it separates partly transparent mirror covering and glue layer from the zone of electron beam pumping, and therefore increases the lifespan of laser target, on the other hand, this layer having wider bandgap does not absorb generated emission and allows, therefore, an increase in the operating temperature of the laser target. The problem is that it is very difficult to make this device with an adequate efficiency because centers of non-emitting recombination are formed near the interface boundary (heteroboundary) between two relatively thick semiconductor layers made of II–VI compounds and laser efficiency is rather low (3% at 300 K.).

The nearest prior art to the present invention is a laser cathode-ray tube consisting of a source for an electron beam, a means for controlling the beam, and a laser target which includes two mirrors forming optical resonator, a semiconductor medium located between the mirrors, and a substrate for optical resonator (E. I. Gordon et al, U.S. Pat. No.4,539,687 of Sep. 3, 1985, Int.Cl. HOIS 3/19). The semiconductor medium is comprised of a three-layer heterostructure of lattice-matched III–V compounds. Heterostructure is defined to mean a structure with atomic bonds between its layers which are made of different crystalline materials. Lattice matching means that the crystal structures of these compounds are identical in that their crystal lattice parameters differ not more than about 0.1%. This is an important condition of growing a heterostructure with a low number of structure defects, because such a structure can be used for achieving high laser efficiency at room temperature.

The disadvantage of the Gordon device is that the lattice-matching requirement severely restricts the choice of semiconductor compounds which can be used for defectless or low defect heterostructure lasers which are to be stimulated with longitudinal pumping by the electron beam. Additionally, such lasers can only be constructed for use in infrared spectral region because they are based on semiconductor compounds, such as GaAs and AlAs, which have lattice periods that differ by less than 0.1%. However, even in the case of GaAlAs-laser, its efficiency is still not high enough (see E. I. Gordon et al).

SUMMARY OF THE INVENTION

It is an object of the present invention to construct a laser target that would achieve high efficiency of lasing with a long lifespan in laser cathode-ray tube using a broad class of semiconductor compounds.

Another object of the invention is to increase of the efficiency of the laser cathode-ray tube which emits light in visible and near ultraviolet regions of spectrum with the laser target operating at the room temperature.

These and other objects are accomplished in a laser cathoderay tube comprising a source of an electron beam, a means of its controlling the beam, and a laser target, which consists of two mirrors forming an cavity resonator, a semiconductor structure placed between the mirrors, and a supporting substrate for the resonator. According to the invention, the semiconductor structure comprises elastic strained elements which crystal parameters in a free state differ by up to 10% or more but their proportions are adapted so that these elements have coherent boundaries in the structure.

More specifically, in order to achieve acceptable laser parameters at room temperature the present invention uses a semiconductor perfect structure having active and passive elements with different bandgaps. A main idea of the invention is that this perfect structure is not made of semiconductor crystalline materials having an identical structure and practically identical (matched) parameters of crystal lattice (a group of such materials being very small) but is made of materials selected from a group consisting of crystalline compounds which crystal lattice parameters differ by up to 10% or more, and structure elements made of these materials are small enough to make a perfect structure. A perfect structure means an absence of any structural defects at or near boundaries between the structure elements. This occurs if the crystal lattice periods of two adjacent elements are equal to each other along their interface. In other words, the structure's elements have coherent boundaries. These elements are also strained in the structure because of their materials have essentially different crystal lattice periods when they are in a free state.

In order to simplify the design and the manner of manufacturing, the structure is made planar with mirrors that are coated on the opposite sides of the semiconductor structure, so a perpendicular to the semiconductor structure is the longitudinal axis of the resonator, and the strained elements are formed as strained layers oriented perpendicular to the axis of the resonator. The thicknesses of the layers depend on the degree of the lattice mis-matching which occurs in these layers in a free unstrained state. The less is this mismatching, the more can be the thickness of these layers. Each occurrence of mis-matching places a limit on the thickness of each layer and an excess of thickness will result in the appearance of structural defects, such as a mis-matching dislocation at the boundaries of these layers, and the boundary become incoherent (J. W. Matthews and A. E. Blackeslee. J. Crystal Growth. 1974, Vol.27, p.118). The appearance of the mis-matching dislocation decreases elastic strainings in the structure layers. These elastic strainings increase with increasing of the thicknesses of adjacent structure layers up to the thickness limit. It important to note that if the boundaries between the layers are incoherent, the lasing threshold of the laser target increases and the efficiency of lasing decreases. This results in decreasing of the power and the brightness of the laser cathode-ray tube.

In the laser targets made of semiconductor compounds which crystal lattice parameters differ by more than 10%, it is more preferable to include at least one layer with the thickness of a monolayer.

One of the important differences of the present laser target from the injection semiconductor lasers, wherein strained layer heterostructures are used, is that all of the dimensions of the present semiconductor structure are larger. This is especially true regarding structure thickness. The main reason is that the excited region of the laser target is determined by the penetration depth of the electron beam which can exceed 10 μm in high-power projector cathode-ray tubes. In the excited region of injection lasers is determined by the free path length of nonequilibrium carriers which is less the 1 μm. Therefore, all main elements of the laser target have sizes from 0.5 to 10 μm or more perpendicular the structure layers. On the other hand, the majority of known semiconductor materials used in laser targets, especially those which emit light in the visible or ultraviolet regions of the light spectrum have difference of the lattice parameters of several percents. In the case of this large mis-matching, the thickness limit is less than 10 nm. In order to make a perfect semiconductor structure of these materials, it should consist of several dozens, or even hundreds of strained layers which thicknesses are less than the thickness limit. In this case, in order to simplify the design of the laser target and the technology of its manufacturing, it is worthwhile to use a plurality of alternating strained layers of two or more compounds, these layers having constant thicknesses, and forming a one-dimensional superlattice. (This means that a crystal lattice having basic crystal periods has additional periodic alternation of atoms along one of directions. Of course, this additional periodic alternation results in small variation of basic crystal period along this direction.) In most cases it is enough that only directly excited region is made like one-dimension superlattice, but for increasing lifespan of laser target it is preferable to do whole semiconductor structure and also one of the mirrors in this way. Note also that a one-dimensional superlattice of two or more crystal compounds possesses new properties which can decrease the lasing threshold and increase the efficiency of laser cathode-ray tube as a whole.

In order to get emission in the region from near infrared to near ultraviolet spectral region, it is worthwhile that elements of semiconductor structure are made of at least two compounds selected from group consisting of II–VI and III–V compounds, and their solid solutions. These compounds should have energy gaps differing from each other by at least 7 mev. Because the laser targets work mainly at temperatures higher than 80 K. (approximately 7 mev in energy), the manufacturing of laser targets from heterostructure with a difference of energy gaps of its elements less than 7 mev, will not result in improving of lasing characteristics in comparison to the ones of laser targets with uniform active semiconductor medium, but will result only in complicating of the manufacturing process.

One-dimensional varizone superlattice is the simplest to manufacture, and it is preferable to making semiconductor structure of crystal compounds having small mis-matching of the crystal lattice. In this case, the additional periodic alternation of atoms of the superlattice occur gradually along one of the directions. It results in an appropriate gradual change of bandgap. This change can be achieved by means of either change of chemical composition of the solid solution which is used or by changing the density and the type of doping. An example of a varizone superlattice may be a structure having alternative layers of two binary compounds which have boundaries between each other, which are not sharp, but smooth. Growing of such structures is simple enough and has the advantage of producing a laser target with a varizone superlattice is that is inexpensive to manufacture with inexpensive and more productive growing equipment.

More complicated in manufacturing but the most effective in decreasing of lasing threshold and increasing of efficiency of the laser target is a laser target which has the following design: each second layer of a multilayered semiconductor structure has a constant thickness and is made of a semiconductor of the same composition, and the first and all subsequent intermediate layers have different thicknesses and are made of solid solution of semiconductor binary compounds of one type, having energy bandgap wider than every second layer, and the composition is changed in correspondence with the thickness of the layer by the value necessary for establishing crystal lattice period common for all layers along these layers.

The main point of this invention is that it is necessary to use in the laser generation as much as possible energy of nonequilibrium carriers of the slightly excited regions of semiconductor structure, the presence of which is the consequence of nonuniformity of excitation of laser target in the laser cathode-ray tube. Therefore, it is preferable that the sum of thicknesses of two neighbor active and passive layers of the semiconductor structure be changed along the longitudinal axis of the optical cavity inversely proportionally to the part of energy of electron beam absorbed by these two layers. In this case it is worthwhile to achieve the period of crystal lattice along the layers common for all layers, which provides a perfect semiconductor structure with high efficiency. Such semiconductor structures are made of layers of constant composition of a first binary compound and layers with variable composition which are made of solid solution of the first binary compound and a second binary compound with the molar content of the second binary compound in the solid solution in each layer with variable composition varying depending on the thickness of the layer according to the following equation:

$$x = C \cdot \{[1 + D \cdot (1 + h_1/h_2)^{0.5}] - 1\} \quad (1)$$

where x is the molar content of the second compound in the solid solution, $h_1$ is the constant thickness of the layers of the first compound, $h_2$ is the variable thickness of the solid solution, and C and D are the positive numbers that depend on the choice of the first and second compounds and the crystal lattice period of the structure with strained layers along the layers.

In all cases it is worthwhile to choose the proportions of the semiconductor structure and the energy of the electron beam being mutually adapted so that the part of the electron beam energy, absorbed in the structure, is not less than 50%. In the case of a planar semiconductor structure, this condition corresponds to a choice of the structure thickness being more than about 0.2 electron straightened path length in the semiconductor structure $R_o$. This value is usually used for characterization of electron dispersion process in different media. (Each electron penetrating into a solid state medium collides with medium atoms, giving up a part of its energy to these atoms, before moving along a broken curve up to a full stop. The total length of this broken curve is $R_o$.) It should be noted that specific excitation depth of the medium is usually 4 to 5 times less than $R_o$. Thus, if the thickness of the semiconductor structure is less than $0.2R_o$, then the efficiency of the laser cathode-ray tube will decrease considerably because some part of the excitation energy will penetrate into the substrate and will be converted entirely into heat.

Note also that the structure thickness does not need to be very large. It is preferable that it is less than $2 R_o$. If the structure thickness is more than $2 R_o$, then it will result in the increase in the threshold of the laser target because of the increase in losses in unpumped part of the structure and the increase of diffraction losses which, in turn, will result in decrease of efficiency of the laser cathode-ray tube.

To decrease a laser threshold, the thicknesses of active and passive layers should be mutually adapted so that nonequilibrium carries generated by the electron beam concentrate into active layers with maximum density. For this purpose, the thickness of an active layer should be less than the passive layers adjacent to this active layer, and the thickness of any passive layer should be less than a path length of the nonequilibrium carriers generated by electron beam in the passive layer.

Since one of the surfaces of laser target in laser cathode-ray tube is irradiated with a scanning electron beam and the thickness of the semiconductor structure is low, then the heat produced in the structure can be transmitted to the substrate through only one of the mirrors located between the substrate and the structure. Therefore, in order to improve heat-dissipation it is advisable to make the active semiconductor medium and at least one of the mirrors facing the substrate entirely as a heterostructure.

To further improve heat-dissipation and to also increase the lifespan of the laser target, and hence of the laser cathode-ray, tube the use of a monocrystalline substrate is suggested, wherein one of the mirrors and the semiconductor medium are coherently grown on it, so that the crystal lattice period of the substrate along the surface of the laser target matches the crystal lattice period of the mirror and semiconductor medium.

BRIEF DESCRIPTION OF THE DRAWING

The invention will now be described with reference to specific non-limiting embodiments of the invention illustrated in the accompanying drawings, in which identical details are shown at identical reference numerals and in which.

DETAILED DESCRIPTION OF THE PREFERRED EMBODIMENTS

Figure 1:
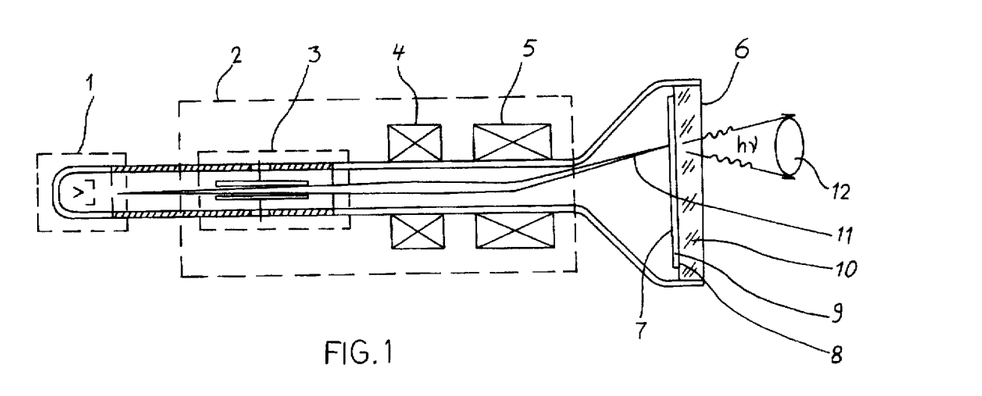
FIG. 1 represents the general view of the laser cathode-ray tube in accordance with one embodiment of the invention.

As shown in FIG. 1, a laser CRT according to the invention has a source of electrons 1 as a triode electron gun, a means of controlling the electron beam 2, which includes an electrostatic modulator 3, a focusing system 4, a deflecting system 5, and a laser target 6, consisting of an optical resonator made of mirror covers 7 and 8, a semiconductor structure 9, and a transparent substrate 10. The laser CRT may be made as a sealed-off tube and its single elements are placed either in a vacuum outside of it, as shown on FIG. 1. The laser CRT, however, can be made as a demountable system similar to an electron microscope. Specific design of the laser CRT and its elements 1–5 is not the subject of the invention. The herein invention concerns laser target 6 whose design, however, depends on energy of electrons of the electron beam 11 irradiating the target 6 and also on the type of the output of the laser emission 12 from the target 6. Laser emission may have output through the substrate 10 (transmission-type tube), and in this case the substrate must be transparent and thermoconductive, or through the mirror 7 (reflection-type tube). In the latter case, the substrate does not necessarily have to be transparent but the output of the laser emission from the vacuum space would be considerably hampered.

The laser CRT works in the following way. The source of electrons 1 forms slightly diverging electron beam 11 which current is modulated by the electrostatic modulator 3, focused by the focusing system 4, and deflected into the given point on the laser target 6 by the deflecting system 5. Penetrating through mirror 7, electron beam 11 generates nonequilibrium electron-hole pairs in the semiconductor structure 9. Cathodeluminescence and optical amplification arises in structure 9 and in the presence of the optical resonator formed by mirrors 7 and 8. As a result, there occurs the generation of laser ray 12 emerging from the vacuum space through the transparent substrate 10.

Figure 2A:
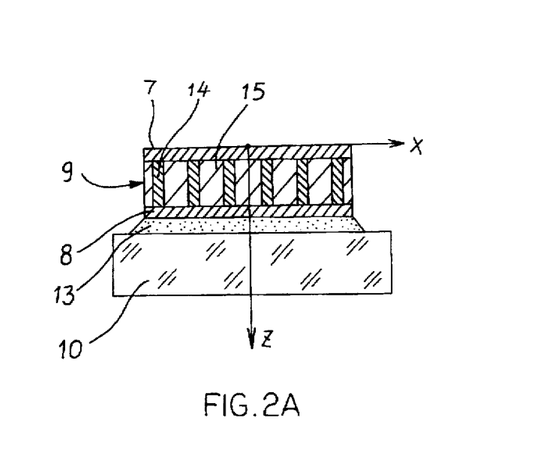
FIG. 2a is an enlarged view of a portion of the laser target of FIG. 1.
Figure 2B:
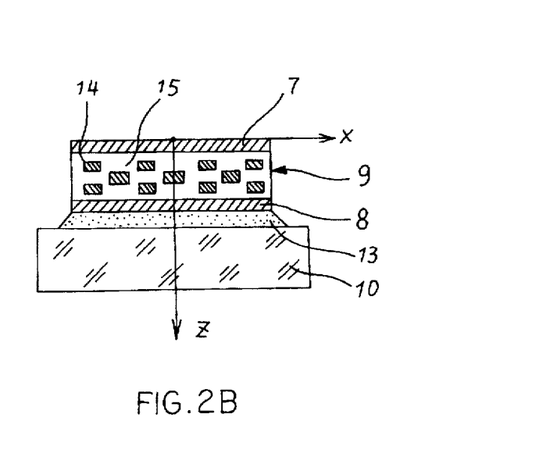
FIG. 2b is an enlarged view of a portion of the laser target of an alternative embodiment of a laser cathode-ray tube constructed according the invention.

With reference to FIGS. 2a and 2b, the laser targets the embodiments our invention have the semiconductor structure 9, placed into the optical resonator formed by mirror covers 7 and 8 and fastened with a fastening layer 13 to substrate 10, contains elastically strained elements of at least two types. Element 14 is made of narrower gap compound and element 15 of wider gap compound. There can be different types of forms of these elements depending on the field of use of the laser CRT. Elements 14 may be flat layers oriented in the plane yz (as in the FIG. 2a where axis y is perpendicular to the plane of the Figure), or in the plane xz, or in the plane xy (see below FIG. 3) or in the some other plane, separated by similar flat but usually thicker layers element 15.

Element 14 may also be made as limited along all the axes of three dimensional figures, such as parallelepipeds, cubes, spheres, drops, etc. as shown in FIG. 2b, with element 14 embedded into the medium-element 15. In all cases boundaries between the elements 14 and 15 are coherent according to the invention. The condition of coherency of the boundaries sets practical limitations on the requirements regarding the sizes of elements 14 and 15 when made of materials, that have crystal lattice parameters which differ in a free state. With an increase in this difference, sizes of the elements 14 and/or 15 decrease in at least one of the directions. When the difference in the lattice parameters is more than 10%, sizes of the elements 14 or 15, in at least one of the directions, cannot be greater than one monolayer. Particularly crystals of solid solutions of some compounds may be considered as structures with strained elements. Thus, for instance, in the crystals of solid solution $CdS_{1-x}Se_x$, the distance between the atoms of cadmium and selenium is somewhat increased in comparison to the case of pure CdSe, and the distance between Cd and S on the contrary, is decreased. In this case, strained elements are separate chemical bondings.

Elements 14 and 15 can also form a superlattice in which a spatial dependence of an energy gap have translational symmetry of the form $Eg(r+q)=Eg(r)$ where $q=n_1 \cdot a_1 + n_2 \cdot a_2 + n_3 \cdot a_3$; where, $n_1$, $n_2$, $n_3$ are the whole integers and, $a_1$, $a_2$, $a_3$ are the basis vectors of elementary cell of the crystal. These can be one-dimensional, two-dimensional, and three-dimensional superlattices.

Note that the elements 14 and 15 do not necessarily have to be made of compounds with different energy gaps in a free state. However, in this case is preferable that these component being parts of semiconductor structure 9, and being in the strained state, have necessary difference of the energy gap.

The design of the semiconductor structure with at least two types of elements 14 and 15 is necessary, on one hand, for arranging electron and optical confinements in order to decrease the lasing threshold and improve the other characteristics of laser target what is widely used in injection lasers. On other hand, it is better for matching of the crystal lattice parameters of the semiconductor structure 9 on the boundaries with crystal mirrors 7 and 8 and, even substrate 10. Generally, mirrors 7, 8, substrate 10, and fastening layer 13 may be non crystal or non lattice-matched. However, for the improvement of the CRT's lifespan and for increasing the average power of radiation by means of an increase in heat dissipation of the semiconductor structure 9 and also for simplification of the manufacturing technology, it is worthwhile to make at least one of the mirrors and/or substrate and fastening layer crystalline and lattice-matched with each other and with the semiconductor structure. Note that lattice-matching can be achieved not only by designing the semiconductor structure 9 of several strained elements, like elements 14 and 15, but also by means of designing the mirrors 7 and 8, as well as the substrate 10 and fastening layer 13 to consist of their own strained elements.

Figure 3:
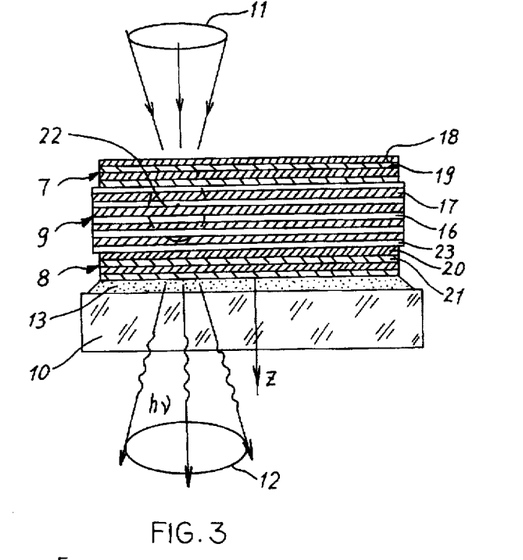
FIG. 3 is an enlarged view of a portion of the laser target of a third embodiment of a laser cathode-ray tube constructed according the invention.

The simplest example of the preferred embodiments in terms of manufacturing of the laser target is shown on the FIG. 3. In this case, the semiconductor structure 9 consists of alternating strained elements 16 and 17 made as layers perpendicular to the axis z, which is the longitudinal optical axis of the resonator, formed by the mirror covers 7 and 8, which in turn, consist of alternating layers 18, 19 and 20, 21. The semiconductor structure 9 is made as a plate attached to the substrate 10 from the side of mirror cover 8 through fastening layer 13.

The number of types of the strained elements of the semiconductor structure can be more than two. Moreover, they do not need to alternate. All of them could have different compositions and thicknesses, as well. In particular, a separate layer may have the thickness of one monolayer. However, for simplicity of manufacturing, it is worthwhile to make the semiconductor structure with a small number of different alternating layers with constant thicknesses, forming a one dimensional superlattice.

Strained layers 16 and 17 may be made of semiconductor II–VI or III–V compounds, or its solid solutions differing in the energy gap by at least 7 mev.

Figure 4:
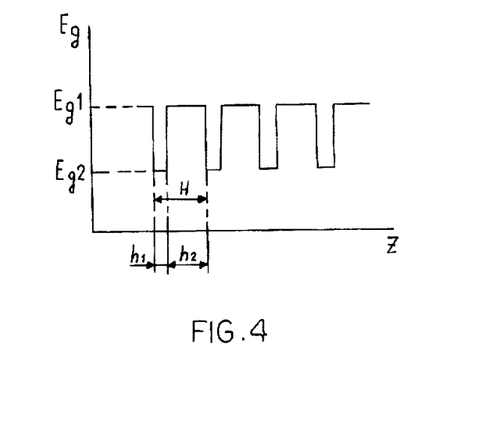
FIG. 4 shows a graphic representation of distribution of the energy bandgap E of the semiconductor structure of the laser target of FIG. 3 along a normal to the surface of the laser target.

The distribution of the energy gap Eg of the semiconductor structure 9 along the z-axis in accordance with one embodiment of the invention is shown on FIG. 4. Strained layer 16 with the narrower energy gap is an active layer and has the thickness $h_1$, and the strained layer 17 with wider energy gap is a passive layer and has the thickness $h_2$, so a superlattice with period $H=h_1+h_2$ is formed.

Figure 5:
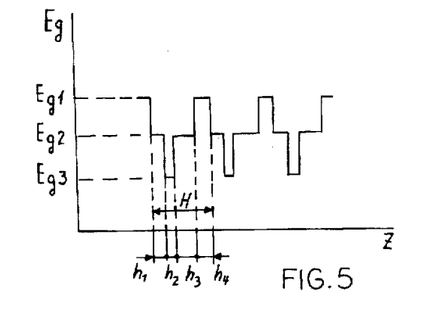
FIG. 5 shows a graphic representation of distribution of the energy bandgap E of the semiconductor structure along a normal to the surface of the laser target in accordance with another embodiment of the invention.

With reference to FIG. 5, the superlattice of the semiconductor structure is formed by four layers with thicknesses $h_1$, $h_2$, $h_3$, $h_4$ and energy gaps $Eg_1$, $Eg_2$, $Eg_3$. In some cases, use of two additional layers with the intermediate energy gap E around the active layer with the lowest E allows for the achievement of a more efficient electron confinement (to achieve larger concentration of nonequilibrium electron-hole pairs in active layers), which in turn allows the decrease the lasing threshold and the improvement of other characteristics of the laser target.

Figure 6:
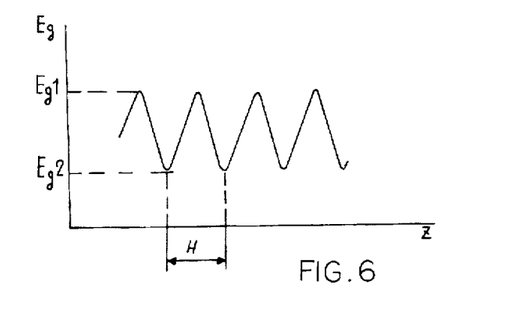
FIG. 6 shows a graphic representation of distribution of the energy bandgap E of the semiconductor structure along a normal to the surface of the laser target in accordance with the embodiment of the invention in which the varizone semiconductor structure is used.

If one increases number of intermediate layers it is then possible to come to a different design of the semiconductor structure, namely a varizone superlattice which energy gap distribution represented in the FIG. 6. The varizone superlattice is not worse than discrete ones in many parameters but it can be made using simpler and more economical technologies, such as chemical vapor deposition (CVD). Discrete superlattices, on the other hand, can be grown by only lower temperature epitaxy as metallo-organic chemical vapor deposition (MOCVD) or molecular beam epitaxy (MBE).

Mirror covers 7 and 8 can be made as single layer consisting mainly of a metal that allows it to achieve a high reflection coefficient (silver, aluminum), or as a plurality of alternating transparent mainly quarter-wave layers with greater (layers 18 and 20) and lower (layers 19 and 21) refraction indices (see FIG. 3), or the combination of both metal and transparent layers. In the case of a transmission-type tube as shown in the FIG. 3, when the generated irradiation hv emerges from the laser target through the substrate 10, the fastening layer 13 and substrate 10 must be at least partly transparent, mirror cover 8 partly transparent (transparency from 1 to 20%), and the mirror cover 7 must be mainly high-reflecting. In the case of the reflection-type tube, when the generated irradiation hv emerges through the mirror cover 7, the fastening layer 13 and substrate 10 may be non transparent, for instance, made of metal, mirror cover 7 is partly transparent, and mirror cover 8 is mainly high-reflecting. Mirror covers 7 and 8 are usually made amorphous. For their manufacturing one often uses vacuum sputtering of metal or oxides, such as $SiO_2$, $ZrO_2$, $TiO_2$, $Al_2O_3$, $HfO_2$, et al.

Fastening layer may be made as glue layer, for instance of epoxy glue of OK-72 F type (Russian type), or as a glass layer. Substrate is usually made of highly thermoconductive material: sapphire or garnet for a transmission-type tube or copper, silicon, etc. for reflection-type tube.

To improve heat-dissipation and increase a CRT's lifespan, it is worthwhile to make crystalline at least one of the mirror covers 7 or 8, substrate 10 and fastening layer 13. In this case, it is not necessary to fulfill the condition of coherency of the boundaries between the mirror covers 7, 8, semiconductor structure 9, fastening layer 13, and substrate 10. This is because the existence of structure defects outside the semiconductor structure 9 does not directly affect the power characteristics of the laser target. However, these defects may be a source of new defects that "grow" into the structure during exploitation of the laser target and worsen the characteristics of the laser target mainly by decreasing its lifespan. Therefore it is worthwhile that the substrate 10 is single-crystalline and the mirror 8 between the substrate 10 and semiconductor structure 9, and the semiconductor structure 9 itself are coherently grown on it, while the crystal lattice period of the substrate along the surface of the laser target matches the crystal lattice period of the mirror 8 and semiconductor medium 9. It is even better if the mirror 7 has the same properties.

Laser targets of the cathode-ray tubes that are used for different purposes are pumped by an electron beam with an energy that ranges from 30 to 100 kev. Each primary electron of the high energy, penetrating into the laser target, moves in it piecewise. An straighten path length of the electron $R_o$ depends on the average atomic number of the structure, on the density of this structure and the energy of the electron. Specific excitation depth of the structure is about 0.2 $R_o$. Therefore, thickness of the semiconductor has to be not less than this value, otherwise, more than 50% of electron beam energy would not be used for creation of the nonequilibrium carriers, and the efficiency of the laser target emission would decrease. The thickness of semiconductor structure could be larger than 0.2$R_o$, although if it exceeds 2 $R_o$, then the lasing threshold increases because of an increase of diffraction losses at excitation by a sharply focused e-beam, and therefore the efficiency of the laser screen decreases. For the electron energy of 30 to 100 keV and the use of II-VI and III-V compounds, the value $R_o$ is about from 10 to 75 μm. So it is preferable that the thickness of the semiconductor structure will be from 2 to 20 μm for 30 keV and from 15 to 150 μm for 100 keV.

The thickness of the metal mirror cover usually does not exceed 0.1 μm and practically does not decrease the excitation depth of the semiconductor medium when it covers the radiated surface of the laser target (mirror 7). The thickness of the interference multilayer cover made of 6 to 8 alternating quarter-wave layers $SiO_2$ and $TiO_2$ with reflection coefficient R≈90% usually does not exceed 1 μm. However, if the mirror is made crystalline, then adjacent alternating layers must have similar crystal structures, and this usually leads to a small difference in the refractive index. For this reason the number of layers in the crystal mirror must be greater by the order of magnitude and their total thickness may reach 10 μm or even more. The use of a passive mirror, such as a bombarded one, is not practically possible because its thickness is comparable with excitation depth at energy 75 keV. However, there is a possible variant when the semiconductor structure performs simultaneously the functions of at least one of the resonator mirrors. In this case, at least part of one of the alternating layers of the mirror is optically active.

Note also that thickness of one of the alternating quarter-wave layers of the mirror is about 60 to 80 nm. In order for the mirror to have coherent boundaries between the layers (which, as it was mentioned above, increases the CRT's lifespan), mismatching of the crystal lattice parameters of the adjacent layers must be very little, about 1% and less. This drastically decreases the number of compounds that may be used for manufacturing the mirrors. Thus, in order to broaden this set of compounds, it is worthwhile to make at least one type of the quarter-wave layers a superlattice. For example, quarter-wave layers with a lower refractive index are made of ZnS/CdS-superlattice with period of several monolayers.

The substrate is usually made thick for providing sufficient mechanical strength that can stand atmosphere pressure overall with the diameter of up to 60 mm and providing for sufficiently effective heat removing, especially if the heat is removed through the side surface of the substrate. In that way, its thickness is from 1 to 20 mm. In an ideal case, when the semiconductor structure 9, mirror 8, and substrate 10 have coherent boundaries, crystal lattice period of the laser target along its surface is practically determined by the crystal lattice period of the substrate because the substrate is considerably thicker than the other elements of the laser target.

The variant easier to realize is when the lattice of the substrate 10 does not match the one of the semiconductor structure 9. In this case, fastening layer performs the functions of a buffer layer that has structure defects of mismatching dislocation type but matches crystal lattices of the mirror 8 and substrate 10. In particular, a superlattice with strained layers also may be used as a buffer layer. Fastening layer 13 may be non-crystal (in this case it indeed only fastens) if the substrate 10 is non-crystal and/or it is not used as a substrate in the growing process of the semiconductor structure 9.

Figure 7:
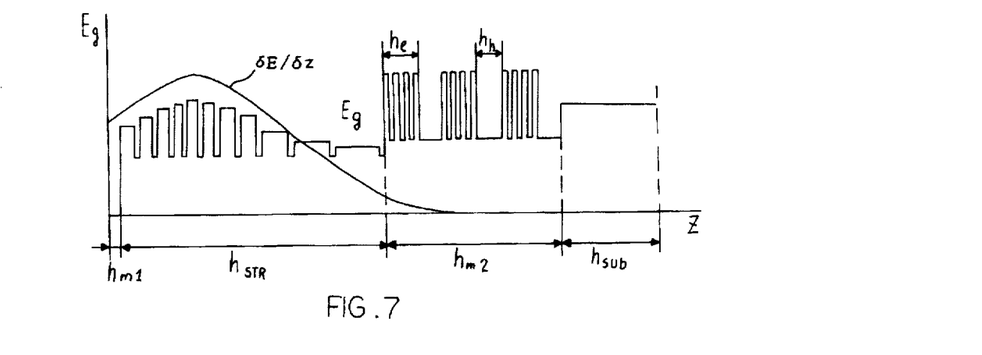
FIG. 7 shows a graphic representation of distribution of the energy bandgap E of the whole laser target along a normal to its surface in accordance with the embodiment of the invention in which the crystalline substrate and the crystalline partly transparent mirror with crystal lattice matched with crystal lattice of the semiconductor structure are used, and in which the structure layer thicknesses are adapted to a curve shown schematically in FIG. 7 how the energy E of electrons is absorbed in the target.

The graph shown on FIG. 7 is the distribution of energy gap of whole laser target along z-axis for the most preferable embodiment in accordance with the invention. The corresponding laser target has the metallic mirror cover 7 (Eg=0)

of the thickness $h_{m1}$, the strained layer semiconductor structure 9 of the thickness $h_{str}$, the multilayer crystalline mirror cover 8 of the thickness $h_{m2}$ and the crystalline substrate 10 of thickness $h_{sub}$ in the absence of the fastening layer 13. The thicknesses of active structure layers having narrower gap and constant thickness, and passive structure layers having wider gap and variable thickness and variable composition, are adapted with an ionization curve of energy losses of the electron beam $\delta E/\delta z$, are also shown in FIG. 7, so that total thickness of two adjacent layers alters along the z-axis inversely proportionally to the fraction of the electron beam absorbed by these two layers. The composition of each passive layer is adapted with its thickness so that boundaries between this passive layer and adjacent active layers are coherent. The multilayer crystalline mirror cover has a plurality of alternating quarter-wave layers with high (thickness $h_h$) and lower (thickness $h_l$) refractive indices, the superlattice serving as the layers with the lower refractive index. The boundaries between all layers of the multilayer crystalline mirror are coherent too. The crystal lattice periods of the structure, the crystalline mirror and the substrate are matched each other.

In operation of the laser target, nonequilibrium electrons and holes generated by the electron beam 11 in the excitation region 22 in FIG. 3 are collected in the layers with narrower energy gap, in the potential wells (where electron confinement occurs). Thus, the high density of the electron-hole pairs, that leads to an optical amplification, is achieved. If there is no electron confinement, then the lasing threshold increases and irradiating characteristics of the laser target get worse. The density of the electron-hole pairs collected in potential wells depends on the volume of the crystal around these wells where they are collected from, and on the quantity of the energy losses of the electron beam in this volume. Because the energy losses change along the depth of the crystal according to the ionization curve ($\delta E/\delta z$ in FIG. 7), then in order to equalize the number of the nonequilibrium electron-hole pairs collected in each well, the thickness of the wider-gap layers should be changed in concordance with this curve. If the thickness of these layers was not changed according to the ionization curve, then a different number of nonequilibrium electron-hole pairs would be collected in different potential wells. This would lead to inhomogeneous broadening of the gain spectrum and resulting finally in an increase of the lasing threshold and a decrease in brightness of irradiation of the laser target.

The ionization curve $\delta E(z)/\delta z$ in FIG. 7 does not have exact analytic description but it may be approximated with sufficient precision by the Gaussian distribution (see B. M. Lavrushin "Research of Semiconductor Quantum Generators on GaAs Basis." Proceedings of P. N. Lebedev Physics Institute. Vol. 59, M., Nauka, 1972, pp.124–205):

$$\delta E(z)/\delta z = A_0 \cdot \exp[(z-a)^2 \cdot b^{-2}] \tag{2}$$

where A is a density of ionization losses in maximum of distribution at z=a; constants A, a, and b for GaAs are:

$$a = 2.3 \cdot 10^{-2} \cdot E - 5.4 \cdot 10^{-4} \cdot E^2, \mu m; \tag{3}$$

$$b = 3.2 \cdot 10^{-2} \cdot E - 7.6 \cdot 10^{-4} \cdot E^2, \mu m; \tag{4}$$

$$A_0 = 2(0.116 + 2.7 \cdot 10^{-3} \cdot E), keV/\mu m; \tag{5}$$

where E is the energy of the electron beam expressed in keV.

If the thickness of the layers of the semiconductor structure 9 with constant composition h and the thicknesses of the other layers h(z) are much less than the parameters of the ionization curve a and b than according to the invention, then it is worthwhile to choose thicknesses of the layers from the condition:

$$h_2(z) + h_1 = const/(\delta E(z)/\delta z) \tag{6}$$

then for the approximation cited above $$h_2(z) = (h_{2o} + h_1) \cdot \exp[(z-a)^2 \cdot b^{-2}] - h_1 \tag{7}$$

where constant $h_{2o} = h_2(z=a)$ is chosen simultaneously with considering achievement of required electron confinement and also necessary quantization in potential wells.

In order for this structure to not have structure defects which worsen the irradiating properties of the laser target, it is necessary that crystal lattice period of all layers be the same along the layers. This is the condition of coherency of the boundaries. In the structure with layers of different thicknesses, this condition is fulfilled if composition of the layers changes in concordance with their thicknesses. Let the layers of the semiconductor structure 9 in FIG. 7, that have less width of energy gap and thus are potential wells, be made of the first binary compound $A_1B_1$ and the layers with a variable composition, being the barriers, be made of solid solution of compound $A_1B_1$ and second binary compound $A_2B_2$. The layers with constant composition have thickness $h_1$, the crystal lattice period along the layer in free state is $a_1$, and the elastic stress $X_x$ along the layers is proportional with coefficient $G_1$ to the period change $\Delta a_1(X_x G_1 \cdot a_1)$; and layers with variable composition have thickness h(z), the corresponding period is $a_1 = a_1 + (a_2 - a_1) \cdot x$ and the corresponding coefficient $G(z) = G_1 + (G_2 - G_1) \cdot x$, where $a_2$ and $G_2$ belong to compound $A_2B_2$. Then condition of coherency of the boundaries is expressed by expression (Y. Kawakami, T. Taguchi, and A. Hiraki. J. Crystal Growth. 1988. Vol.93. pp.714–719):

$$(G_1 \cdot h_1 \cdot a_1 + G \cdot h \cdot a)/(G_1 \cdot h_1 + G \cdot h) = a' \tag{8}$$

or $$\frac{G_1 \cdot h_1 \cdot a_1 + [G_1 + (G_2 - G_1) \cdot x] \cdot h \cdot [a_1 + (a_2 - a_1) \cdot x]}{G_1 \cdot a_1 + [G_1 + (G_2 - G_1) \cdot x] \cdot [a_1 + (a_2 - a_1) \cdot x]} = a' \tag{9}$$

where a' is the period of crystal lattice along layers for whole semiconductor structure 9. From this expression one can obtain the relationship between x and h(z):

$$x = C \cdot \{[1 + D \cdot (1 + h_1/h(z))^{0.5}] - 1\} \tag{10}$$

where;

$$C = 0.5 \cdot [G_1/(G_2 - G_1) - (a' - a_1)/(a_2 - a_1)] \tag{11}$$

$$D = 2/C/[(a_2 - a_1)/(a' - a_1) - (G_2 - G_1)/G_1] \tag{12}$$

Taking into consideration that a' alters in a range from $a_1$ to $a_2$ and $(G_2 - G_1)/G_1$ alters from 0.1 to 0.25 for the majority of II–VI compounds, we obtain that C may have values from 2 to 4.5, and D from 0 to 1.5. For other compounds, the range of values of C and D may be considerably wider.

The more detailed description of a laser CRT utilizing the materials mentioned above is given below by some examples. In these examples, however, materials, dimensions and other operating parameters are provided by way of illustration only, and, unless otherwise expressly stated, are not intended to limit the scope of the invention.

EXAMPLE 1

The laser cathode-ray tube contains known type of electron beam source 1 with an accelerating voltage of 75 keV and a means 2 for its controlling and new laser target 6. The laser target 6 has the first mirror 7 made of silver layer 0.08 µm thick, a semiconductor structure 9 having two parts, a second mirror 8 made of six alternating quarter-wave layers of $SiO_2$ and $ZrO_2$, an epoxy fastening layer 13 having a thickness of 10 µm and a sapphire substrate 10 having a thickness of 2 mm.

The first part of the semiconductor structure having thickness of 10 µm (which is comparable to the depth of excitation by electron beam) and being adjacent to the mirror 7 is made of superlattice formed by alternating strained layers 16 and 17. The passive layers 17 are constructed of ZnS, have a thickness of 2.0 nm and act as a barrier layers. The active layers 16, which are constructed of CdS, have a thickness of 3.4 nm and act as quantum wells.

The second part of the semiconductor structure is a thick passive layer 23, which is located between the first part 9 and mirror 8. Thick layer 23 has a thickness of 30 µm and is made of compound comprised of $Zn_{0.43}Cd_{0.57}S$. The lattice parameter of the second part of the semiconductor structure along the layers is a=5.653 A and is equal to the lattice parameter along the layers of the superlattice mentioned above. Note that this second part is also a passive layer like layers 17, but it differs in that it is thicker and is practically non-strained.

The laser target may be made in the following way. The super-lattice of the alternating strained ZnS-layers 17 (2.0 nm thickness) and CdS layers 18 (3.4 nm thickness) having a total thickness of 10 µm is coherently grown on the GaAs-substrate by the low-pressure MOCVD method described in the article Y. Endoh et al. "Structural and Photoluminescence Characterization of CdS/GaAs Films and CdS-ZnS Strained-Layer Superlattices Grown by Low-Pressure MOCVD Method", Jap. J.Appl.Phys., 1988, Vol.27, pp. L2199–L2202. Then the thick passive layer 23 of $Zn_{0.43}Cd_{0.57}S$ (30 µm thickness) is grown on the super-lattice by atmospheric-pressure organometallic vapor-phase epitaxy (OMVPE) described in the article S. Fujita et al. "Organometallic Vapor-Phase Epitaxial Growth of Cubic ZnCdS Lattice-Matched to GaAs Substrate", J.Cryst. Growth, 1990, Vol.99, pp.437–440. Since the lattice parameters GaAs, superlattice, and passive layer 23 are the same along the layers, then the resulting heterostructure practically does not have structure defects of mis-matching dislocation type. The interference mirror 8 of six alternating layers of $SiO_2$ and $ZrO_2$, is put onto the thick passive layer by the known method of vacuum sputtering. Further, the structure with interference mirror cover 8 is then glued to a sapphire disk 10 using epoxy glue OK-72F(Russian name). Thus, interference mirror 8 becomes located between the semiconductor structure and glue layer. After gluing, the GaAs-substrate is completely etched by the known etchant $H_2O_2:N_4H$ OH. After etching, a silver cover of 0.08 µm thickness is deposited onto the clear surface of the super-lattice by vacuum sputtering.

For the growth of the superlattice, the MOCVD apparatus consists of a vertical cold-wall reactor containing a susceptor heated by a RF radiant heater. Cr-doped semi-insulating (100) GaAs wafer is used as a growth substrate. After chemical etching in a $H_2SO_4$—$H_2O_2$—$H_2O$ 5:1:1 mixture, followed by in 10% Br methanol, the GaAs-substrate is immediately set onto the susceptor and the reactor is evacuated at $1 \cdot 10^{-7}$ Torr. Prior to deposition, the substrate is thermally cleaned at 550° C. in $H_2$ atmosphere for 5 minutes to remove the residual oxidized layer. Dimethylzinc [$(CH_3)_2$Zn, DMZn, 1%] diluted in He gas with concentration of 1% and dimethylcadmium [$(CH_3)_2$Cd, DMCd, 0.1%] are used as the metalorganic alkyl source materials together with 10% $H_2S$ in $H_2$ gas for the epitaxial growth. Substrate temperature is 300° C., flow rate of DMCd, DMZn, and $H_2S$ are $5.80 \cdot 10^{-6}$ mol/min, $6.70 \cdot 10^{-6}$ mol/min, $1.34 \cdot 10^{-6}$ mol/min, respectively. Pressure is 0.6 Torr. Growth time of each layer is controlled by a computer.

For the growth the thick passive layer 23, the OMVPE apparatus is like the MOCVD one but simpler. The semiconductor substrate and its preparation are described above. However, different source gases are used. They are diethylzinc (DEZn), dimethylcadmium (DMCd), and methylmercaptan (MSH). Substrate temperature is 420° C., and flow rate of DEZn, DMCd, and MSH are $7.2 \cdot 10^{-6}$ mol/min, $8.8 \cdot 10^{-6}$ mol/min, and $120 \cdot 10^{-6}$ mol/min, respectively.

In use the laser target is excited with the scanning electron beam with the following parameters: energy of the electrons=75 keV, diameter of the electron spot=20 µm, e-beam current=1 Ma, scanning speed=$10^5$ cm/sec. This yields an irradiation output power not lower than 7.5 W with efficiency not less than 6% and a wavelength=495 nm at T=300° K. At the TV-scanning operating regime, a change in the output power of irradiation after 10 hours of constant operation was not observed. Unlike any of the known solutions, in the present example, the laser cathode-ray tube with heterostructure laser target irradiates in the blue region of spectrum. Use of the design for a laser target according to the invention allows to one increase considerably output power of irradiation and efficiency of the laser CRT in this region of the spectrum (at T=300° K., not less than by two times) without decrease in the CRT's lifespan.

EXAMPLE 2

Example 2 is the same laser cathode-ray tube as in Example 1 with the difference that accelerating voltage of 50 keV is used and the whole semiconductor structure 9 made as heterostructure with strained layers of 10 µm total thickness (approximately 1500 layers). Every second layer is made of ZnSe and has thickness $h_{ZnSe}$=1.5 nm. The first layer of the semiconductor structure, counting from the mirror 7 of the laser target 6 located on the side of the electron beam incidence, and all the following intermediate layers between the ZnSe layers are made of the solid solution $ZnS_xSe_{1-x}$, and have different thicknesses $h_{2n+1}$ and composition parameters of the solid solution x along the axis of optical resonator, which values are determined according to the following table:

Construction of the semiconductor medium of $ZnS_xSe_{1-x}$ matched to the ionization curve.

| No. of the Layer | Layer thickness (nm) | Compound parameter x |
|---|---|---|
| 1 | 12.8 | 0.92 |
| 2 | 1.5 | 0 |
| 2k | 1.5 | 0 |

| No. of the Layer | Layer thickness (nm) | Compound parameter x |
|---|---|---|
| 2k + 1 | 7.1 | 1 |
| 2n | 1.5 | 0 |
| 2n + 1 | $1.5 \cdot \left\{ 5.375 \cdot \exp\left[ \left( \sum_{1}^{2n} h_i - 2500 \right)^2 \cdot 3500^{-2} \right] - 1 \right\}$ | $2.94 \{[1 + 0.656 \cdot (1 + n_{2n}/h_{2n+1})]^{0.5} - 1\}$ |
| Second to last | 1.5 | 0 |
| Last | 470 | 0.83 |

In this case, the semiconductor structure satisfies the equation (7) with the parameters $h_{2o}=4.7$ nm, $h_1=1.5$ nm, $a=2500$ nm, and $b=3500$ nm, and the equation (10) with the parameters $C=2.94$ and $D=0.656$.

The crystal lattice period of the present structure is chosen in such a way that it matches the lattice period of the crystal GaP-substrate with orientation (100)–a'=5.4495 A. This way, the structure described above may be grown on GaP-substrate by the same low pressure MOCVD method described in the Example 1. Of course some details of growing process are different. $H_2Se$ diluted in $H_2$ gas with 10% concentration is used as a source for Se, and the flow rates of DMZn, $H_2S$ and $H_2Se$ are changed for each layer.)

The laser target in the Example 2 irradiates at room temperature at the wavelength of 450 nm with the efficiency not less than 8%. This cannot be achieved by any other known laser in the prior art.

EXAMPLE 3

Example 3 discloses a laser cathode-ray which is similar to Example 1 with the difference that in the laser target. Instead of the sapphire substrate, the laser uses a substrate of a single $ZnSe_{0.94}S_{0.06}$ crystal with orientation (001). The partly transparent mirror of 30 pairs of alternating quarter-wave layers with higher and lower refraction indices and the semiconductor structure of super-lattice ZnS/CdS with 10 μm thickness, the structure described in the Example 1, are grown directly on this substrate by the MOCVD method. Layers with greater refraction index are made of the same material, $ZnSe_{0.94}S_{0.06}$, as the substrate, and the layers with lower retraction index are made of the same super-lattice ZnS/CdS as the active semiconductor medium.

The laser cathode-ray tube disclosed in Example 3 has approximately the same characteristics and advantages over the prior art as the one disclosed in Example 1. But since the laser target in the present example does not contain an organic glue layer, the laser CRT with such a target has certain advantages. It can be exposed to thermovacuum treatment and therefore may be sealed-off, that allows the devise to be simpler by exclusion of the high vacuum-maintaining system. It will also increase the lifespan of the laser target by the elimination of one of the degradation factors, the glue layer, which tends to worsen the target characteristics under the exposure of the electron beam and X-irradiation generated by it. Finally, it increases the average output power of the irradiation by improvement of the heat removal from semiconductor structure by exclusion of the thermal bottleneck caused by the fastening glue layer.

EXAMPLE 4

The laser cathode-ray tube of Example 4 is similar to the one disclosed in Example 1 except that it uses an accelerating voltage of 25 keV. Also the first part of the semiconductor structure has a thickness of 1.3 μm and is comprised of 70 periods of super-lattice with alternating strained layers as follows: GaAs-layers having 14 nm thickness acting as barrier layers and $In_{0.2}Ga_{0.8}As$ having 4 nm thickness acting as quantum wells. The thick passive layer 23 of the semiconductor structure is made of the single-crystalline GaAs and has 80 μm thickness. The first mirror is made of $SiO_2$ layer having thickness of 0.21 μm with a wavelength=950 nm and is applied to the super-lattice and a Cu-layer of 120 nm thickness is applied over the first mirror layer. The second partly transparent mirror is made of 13 alternating quarter-wave layers $SiO_2$ and $ZrO_2$.

The laser target is made in the following way: super-lattice $GaAs/In_{0.2}Ga_{0.8}As$ is grown on the substrate GaAs of 400 μm thickness with orientation of (100)±30' by the MOCVD method. Kryolit layer having 0.5 mm thickness is put on it using the known method of vacuum sputtering. Then the structure is glued by the kryolit surface to the substrate of C-54 glass (Russian name, it has temperature expansion coefficient of $54 \cdot 10^{-7}$ $K^{-1}$) of 5 mm thickness by the OK-72F epoxy glue. After the gluing, the product is placed in water to separate the glass substrate along the layer of the hydroscopic kryolit and remove the kryolit from the surface of the super-lattice. And finally, the metal-dielectric opaque mirror is applied to the superlattice.

Laser CRT in this example operates with the laser target being at the room temperature and emitting on wavelength 950 nm. With the current of the electron beam of 1 mA, the power of the irradiation equals to 1.8 W with 7% efficiency. Such lasing characteristics cannot be achieved by any prior art method.

Given examples do not restrict in any way the set of the materials, constructions and manufacture methods which is covered by the invention.

We claim:

1. A semiconductor laser comprising:
    a laser target;
    a source of electron beam and a means for position and time control of said electron beam on said laser target to generate a laser beam therefrom, characterized in that said target comprises:
    a pair of mirrors, at least one of which is at least partially transparent for said electron beam, forming a cavity resonator at the optical wavelength of said light beam, said control means making said electron beam incident on said electron-transparent mirror;
    a semiconductor structure between said mirrors, said semiconductor structure comprising at least one active strained element and at least one passive strained element having wider bandgap than said active strained element, said strained elements differing in crystal lattice parameters in the free state by 0.1% or more; and, a substrate for supporting said cavity resonator, said supporting substrate positioned adjacent to said mirror being opposite to said electron-transparent mirror; the proportions of said strained elements of said semiconductor structure being mutually adapted so that the boundaries between said strained elements are coherent; the proportions of said semiconductor structure and the energy of said electron beam being mutually adapted so that the part of the electron energy absorbed in said semiconductor structure is not less than 50%.

2. The laser of claim 1 including an evacuable tube, said source being located at one end of said tube and said target at the other end of said tube, said control means including a electrostatic modulator of the current of said electron beam, a focusing system and a deflecting system provided downstream one another in the path of said electron beam between said source and said target.

3. The laser of claim 2, wherein said supporting substrate is transparent and said light beam emanates from said semiconductor structure and through said substrate in essentially the same direction as said electron beam.

4. The laser of claim 1 including a cooling system, said substrate is connected with said cooling system.

5. The laser of claim 3, wherein said substrate is sealed to said other end of said tube made of glass.

6. The laser of claim 1, wherein said strained elements are the strained layers oriented perpendicular to the axis of said cavity resonator.

7. The laser of claim 6, wherein at least one of said strained layers has the thickness of one mono-layer.

8. The laser of claim 6, wherein said strained layers of at least part of said structure are the alternating layers with constant thickness and forming one-dimensional superlattice.

9. The laser of claim 1, wherein at least part of said strained elements of said structure is made of at least two semiconductor materials selected from the group consisting of II–VI and its solid solutions, said materials differing in the energy width of bandgap by at least 7 mev.

10. The laser of claim 1, wherein at least part of said structure is made of varizone semiconductor compound.

11. The laser of claim 6 wherein every second layer of said structure from said electron-transparent mirror downstream in said axis of said cavity resonator is said active layer having a constant thickness and made of a semiconductor compound with constant composition and other layers are said passive layers and made of semiconductor compounds, whose compositions alters in concordance with the thickness of said other layers by the value necessary for establishment of common for all said layers the lattice period along said layers.

12. The laser of claim 11, wherein said active layers made of the first compound and said passive layers are made of the solid solution of said first compound and the second compound, while the molar content of said second compound in said solid solution in each said passive layer is related to the thickness of said passive layer by the following relation:

$$x = C \cdot \{[1 + D(1 + h_1/h_2)]^{0.5} - 1\}$$

wherein x is the molar content of said second compound in said solid solution;

$h_1$ is the constant thickness of said active layers in nm;

$h_2$ is the variable thickness of said passive layers in nm;

C is the positive number depending on the choice of said first and second compound and the crystal lattice period of said structure with said strained layers along said layers; and, D is the positive number depending on the choice of said first and second compound and the crystal lattice period of said structure with said strained layers along said layers.

13. The laser of claim 12, wherein said first and second compounds are selected from the group consisting of II–VI compounds and its solid solutions.

14. The laser of claim 11, wherein the total thickness of two adjacent said active and passive layers changes along said axis of said resonator inversely proportionally to the energy of said electron beam absorbed by said adjacent layers.

15. The laser of claim 6, wherein the thickness of any said active layer is less than the thickness of said passive layers adjacent to this active layer, and the thickness of any said passive layer is less than a path length of nonequlibrium carriers generated by said electron beam in said passive layer.

16. The laser of claim 6, wherein the thickness of said semiconductor structure is not more than about two average straightened path length of electrons of said electron beam in said structure.

17. The laser of claim 6, wherein said structure is planar and said mirrors are coated on the opposite sides of said structure.

18. The laser of claim 17, wherein at least one of said mirrors, which is located between said substrate and said structure, is made of crystalline layers, said crystalline mirror and said structure are made as a whole crystalline structure with said strained layers.

19. The laser of claim 17, wherein said substrate is made of single crystal, said mirror located between said structure and said substrate are successively epitaxially grown on said substrate, while the crystal lattice period of said substrate, said structure, and said mirror are mutually matched along said layers.

20. The laser of claim 19, wherein said substrate is made of crystalline material selected from group consisting of II–VI and its solid solutions, said crystalline material having the band gap wider than one of said active layers.

21. The laser of claim 1, wherein at least part of said strained elements of said structure is made of at least two semiconductor materials selected from the group consisting of III–V compounds and its solid solutions, said materials differing in the energy width of bandgap by at least 7 mev.

22. The laser of claim 12, wherein said first and second compounds are selected from the group consisting of III–V compounds and its solid solutions.

23. The laser of claim 19, wherein said substrate is made of crystalline material selected from group consisting of III–V compounds and its solid solutions, said crystalline material having the band gap wider than one of said active layers.

24. A laser cathode-ray tube comprising:

a vacuable tube;

a electron beam source including cathode, said source located near one end of said tube;

a laser target located at other end of said tube;

a means for focusing and scanning of said electron beam on said target to generate a light beam therefrom essentially parallel to the direction of said electron beam, said target comprising: a transparent substrate sealed to said other end of said tube; a partially transparent first mirror on said substrate; a multilayer semiconductor structure on said first mirror, said structure consisting of alternating passive and active strained layers made of II–VI-compounds and its solid solutions, said active layers having narrower bandgap than said passive layers, said strained layers differing in crystal lattice parameters in the free state by 0.1% or more, the thicknesses of said strained elements of said structure being mutually adapted so that the boundaries between said strained elements are coherent; and a highly reflecting second mirror on said structure, said mirrors forming a cavity resonator therebetween;

a means for applying to said structure a positive potential relative to said cathode of said source;

said electron beam being focused and incident on said second mirror so that electrons penetrate through said second mirror into said structure, thereby to generate said light beam which emanates from said active layers of said structure and through said substrate in essentially the same direction as said electron beam; and, the thicknesses of said semiconductor structure and the energy of said electron beam being mutually adapted so that the part of the electron energy absorbed in said semiconductor structure is not less than 50%.

25. The laser of claim 24, wherein every second layer of said structure from said second mirror downstream in the axis of said resonator is said active layer having a constant thickness and made of a semiconductor compound with constant composition and other layers are said passive layers and made of semiconductor compounds, whose compositions alters in concordance with the thickness of said other layers by the value necessary for establishment of common for all said layers the lattice period along said layers.

26. The laser of claim 24, wherein the total thickness of two adjacent said active and passive layers changes along the axis of said resonator inversely proportionally to the energy of said electron beam absorbed by said adjacent layers.

27. The laser of claim 24, wherein the thickness of any said active layer is less than the thickness of said passive layers adjacent to this active layer, and the thickness of any said passive layer is less than a path length of nonequlibrium carriers generated by said electron beam in said passive layer.

28. The laser of claim 24, wherein the thickness of said structure is not more than about two average straightened path length of electrons of said electron beam in said structure.

29. The laser of claim 24, wherein at least one of said mirrors is made of crystalline layers, said crystalline mirror and said structure are made as a whole crystalline structure with said strained layers.

30. The laser of claim 24, wherein said substrate is made of a single crystal, said first mirror and said structure are successively epitaxially grown on said substrate, while the crystal lattice period of said substrate, said structure, and said mirror are mutually matched along said layers.

31. A laser cathode-ray tube comprising:

a vacuable tube;

a electron beam source including cathode, said source located near one end of said tube;

a laser target located at other end of said tube;

a means for focusing and scanning of said electron beam on said target to generate a light beam therefrom essentially parallel to the direction of said electron beam, said target comprising: a transparent substrate sealed to said other end of said tube; a partially transparent first mirror on said substrate; a multilayer semiconductor structure on said first mirror, said structure consisting of alternating passive and active strained layers made of III-V-compounds and its solid solutions, said active layers having narrower bandgap than said passive layers, said strained layers differing in crystal lattice parameters in the free state by 0.1% or more, the thicknesses of said strained elements of said structure being mutually adapted so that the boundaries between said strained elements are coherent; and a highly reflecting second mirror on said structure, said mirrors forming a cavity resonator therebetween;

a means for applying to said structure a positive potential relative to said cathode of said source;

said electron beam being focused and incident on said second mirror so that electrons penetrate through said second mirror into said structure, thereby to generate said light beam which emanates from said active layers of said structure and through said substrate in essentially the same direction as said electron beam; and, the thicknesses of said semiconductor structure and the energy of said electron beam being mutually adapted so that the part of the electron energy absorbed in said semiconductor structure is not less than 50%.

32. The laser of claim 31, wherein every second layer of said structure from said second mirror downstream in the axis of said resonator is said active layer having a constant thickness and made of a semiconductor compound with constant composition and other layers are said passive layers and made of semiconductor compounds, whose compositions alters in concordance with the thickness of said other layers by the value necessary for establishment of common for all said layers the lattice period along said layers.

33. The laser of claim 31, wherein the total thickness of two adjacent said active and passive layers changes along the axis of said resonator inversely proportionally to the energy of said electron beam absorbed by said adjacent layers.

34. The laser of claim 31, wherein the thickness of any said active layer is less than the thickness of said passive layers adjacent to this active layer, and the thickness of any said passive layer is less than a path length of nonequlibrium carriers generated by said electron beam in said passive layer.

35. The laser of claim 31, wherein the thickness of said structure is not more than about two average straightened path length of electrons of said electron beam in said structure.

36. The laser of claim 31, wherein at least one said mirrors is made of crystalline layers, said crystalline mirror and said structure are made as a whole crystalline structure with said strained layers.

37. The laser of claim 31, wherein said substrate is made of a single crystal, said first mirror and said structure are successively epitaxially grown on said substrate, while the crystal lattice period of said substrate, said structure, and said mirror are mutually matched along said layers.

* * * * *